(12) United States Patent
Su et al.

(10) Patent No.: US 9,590,049 B2
(45) Date of Patent: Mar. 7, 2017

(54) SEMICONDUCTOR COMPOSITE FILM WITH HETEROJUNCTION AND MANUFACTURING METHOD THEREOF

(71) Applicants: Hung-Der Su, Pingzhen (TW); Chien-Wei Chiu, Yunlin (TW); Tsung-Yi Huang, Hsinchu (TW)

(72) Inventors: Hung-Der Su, Pingzhen (TW); Chien-Wei Chiu, Yunlin (TW); Tsung-Yi Huang, Hsinchu (TW)

(73) Assignee: Richtek Technology Corporation, Zhubei, Hsinchu (TW)

( * ) Notice: Subject to any disclaimer, the term of this patent is extended or adjusted under 35 U.S.C. 154(b) by 0 days.

(21) Appl. No.: 14/966,818

(22) Filed: Dec. 11, 2015

(65) Prior Publication Data

US 2016/0099320 A1 Apr. 7, 2016

Related U.S. Application Data

(62) Division of application No. 14/048,971, filed on Oct. 8, 2013, now Pat. No. 9,245,746.

(30) Foreign Application Priority Data

Dec. 7, 2012 (TW) .............................. 101145964 A

(51) Int. Cl.
| | |
|---|---|
| H01L 21/336 | (2006.01) |
| H01L 29/205 | (2006.01) |
| H01L 29/78 | (2006.01) |
| H01L 21/02 | (2006.01) |
| H01L 21/306 | (2006.01) |
| H01L 29/20 | (2006.01) |
| H01L 29/12 | (2006.01) |

(52) U.S. Cl.
CPC ........ *H01L 29/205* (2013.01); *H01L 21/0242* (2013.01); *H01L 21/0254* (2013.01); *H01L 21/02378* (2013.01); *H01L 21/02664* (2013.01); *H01L 21/30612* (2013.01); *H01L 29/2003* (2013.01); *H01L 29/7849* (2013.01); *H01L 29/12* (2013.01); *H01L 29/7845* (2013.01)

(58) Field of Classification Search
CPC ................................................. H01L 21/02694
USPC ........................................ 438/105, 191, 938
See application file for complete search history.

(56) References Cited

U.S. PATENT DOCUMENTS

| | | | |
|---|---|---|---|
| 7,368,358 B2 * | 5/2008 | Ouyang | ............ H01L 21/82380 257/E21.094 |
| 8,426,278 B2 * | 4/2013 | Sultan | .................... H01L 21/84 438/155 |

* cited by examiner

*Primary Examiner* — Chandra Chaudhari
(74) *Attorney, Agent, or Firm* — Tung & Associates

(57) ABSTRACT

The present invention discloses a semiconductor composite film with a heterojunction and a manufacturing method thereof. The semiconductor composite film includes: a semiconductor substrate; and a semiconductor epitaxial layer, which is formed on the semiconductor substrate, and it has a first surface and a second surface opposite to each other, wherein the heterojunction is formed between the first surface and the semiconductor substrate, and wherein the semiconductor epitaxial layer further includes at least one recess, which is formed by etching the semiconductor epitaxial layer from the second surface toward the first surface. The recess is for mitigating a strain in the semiconductor composite film.

5 Claims, 7 Drawing Sheets

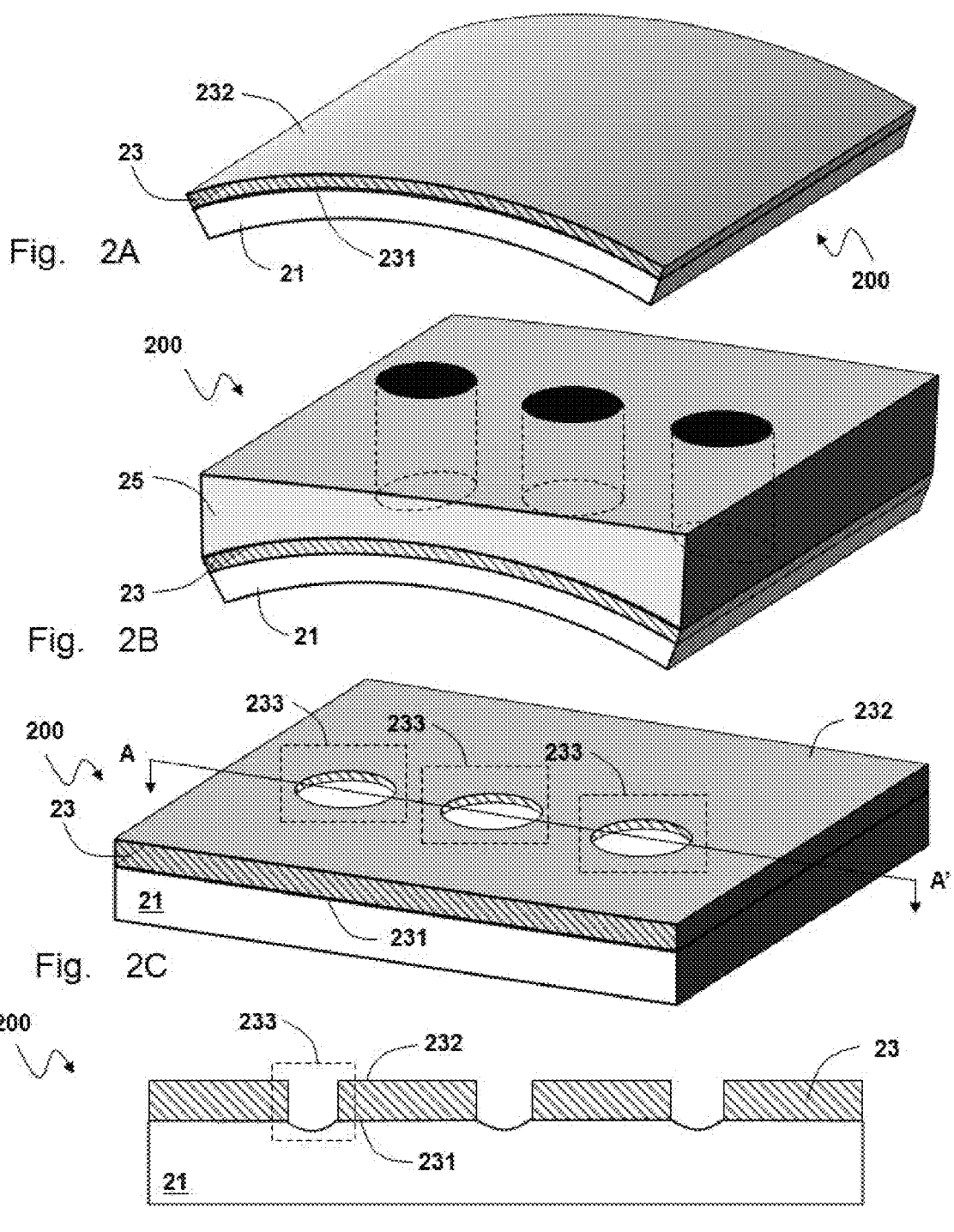

SEMICONDUCTOR COMPOSITE FILM WITH HETEROJUNCTION AND MANUFACTURING METHOD THEREOF

This is a Divisonal of a co-pending application Ser. No. 14/048,971, filed on Oct. 8, 2013.

CROSS REFERENCE

The present invention claims priority to TW 101145964, filed on Dec. 7, 2012.

BACKGROUND OF THE INVENTION

Field of Invention

The present invention relates to a semiconductor composite film with a heterojunction and a manufacturing method thereof, especially a semiconductor composite film with a heterojunction capable of mitigating strain, and a manufacturing method of the semiconductor composite film.

Description of Related Art

FIGS. 1A-1C show cross section views of a semiconductor composite film 100 formed by a semiconductor substrate 11 and a heterogeneous semiconductor epitaxial layer 13, and a heterojunction is formed in between. As shown in FIG. 1A, before forming the semiconductor epitaxial layer, the surface of the semiconductor substrate 11 is substantially flat. After forming the semiconductor epitaxial layer on the semiconductor substrate 11, the heterojunction between heterogeneous materials causes tensile or compressive stress and a tensile or compressive strain is accordingly generated to cause bending, as shown in FIGS. 1B and 1C.

In general, after manufacturing the semiconductor composite film with a heterojunction, some subsequent manufacturing processes will be performed such as heat treatment or surface mechanical polishing, which can easily cause cracking. Therefore, either the yield is unsatisfactory, or a protection process or measure should be taken, both of which will increase the manufacturing cost.

In view of the above, the present invention provides a semiconductor composite film with a heterojunction and a manufacturing method thereof, which are capable of mitigating the strain to provide a more robust semiconductor composite film, and to reduce the manufacturing cost.

SUMMARY OF THE INVENTION

The present invention provides a semiconductor composite film with a heterojunction and a manufacturing method thereof.

In one aspect, a semiconductor composite film with a heterojunction is disclosed according to the present invention. The semiconductor composite film includes: a semiconductor substrate; and a semiconductor epitaxial layer having a first surface and a second surface opposite to each other, the semiconductor epitaxial layer being formed on the semiconductor substrate, wherein the heterojunction is formed between the first surface and the semiconductor substrate, and wherein the semiconductor epitaxial layer further includes at least one recess, which is formed by etching the semiconductor epitaxial layer from the second surface toward the first surface. The recess is for mitigating a strain in the semiconductor composite film with a heterojunction.

In another aspect, the present invention provides a manufacturing method of a semiconductor composite film with a heterojunction. The method includes: providing a semiconductor substrate; forming a semiconductor epitaxial layer on the semiconductor substrate, the semiconductor epitaxial layer having a first surface and a second surface opposite to each other, wherein a heterojunction is formed between the first surface and the semiconductor substrate; and forming at least one recess, which is formed by etching the semiconductor epitaxial layer from the second surface toward the first surface for mitigating strain in the semiconductor composite film with a heterojunction.

In a preferable embodiment of the present invention, at least one semiconductor device is formed in or including the semiconductor epitaxial layer, and the recess does not affect the function of the semiconductor device.

In a preferable embodiment of the present invention, the recess has a bottom, and the recess penetrates the semiconductor epitaxial layer such that the bottom is in the semiconductor substrate.

In another preferable embodiment of the present invention, the recess has a bottom, and the bottom is substantially on the same plane as the heterojunction.

In another preferable embodiment of the present invention, at least one semiconductor device is formed in or including the semiconductor epitaxial layer, and the recess does not overlap with the semiconductor device.

The objectives, technical details, features, and effects of the present invention will be better understood with regard to the detailed description of the embodiments below, with reference to the drawings.

BRIEF DESCRIPTION OF THE DRAWINGS

FIGS. 1A-1C show cross section views of a semiconductor composite film 100 formed by a semiconductor substrate 11 and a heterogeneous semiconductor epitaxial layer 13, wherein a heterojunction is formed in between.

FIGS. 2A-2D show the first preferable embodiment of the present invention.

DESCRIPTION OF THE PREFERRED EMBODIMENTS

Figure 1A:
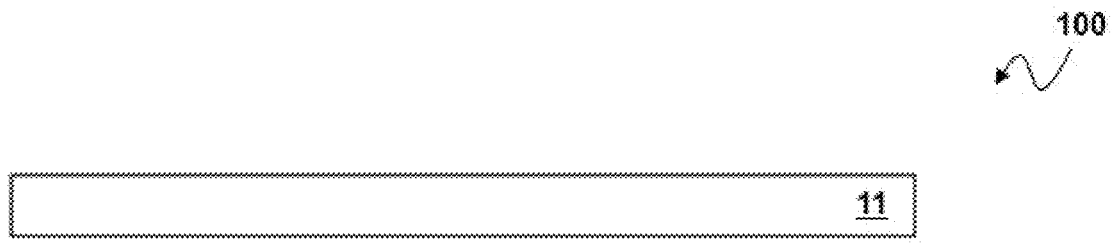
Figure 1B:
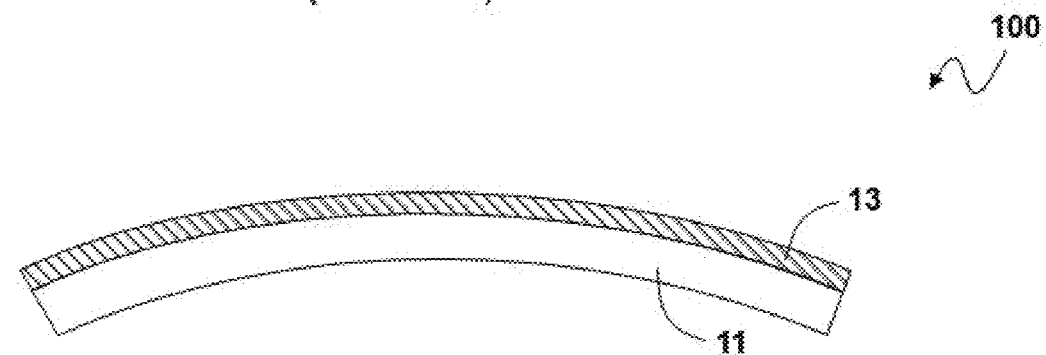
Figure 1C:
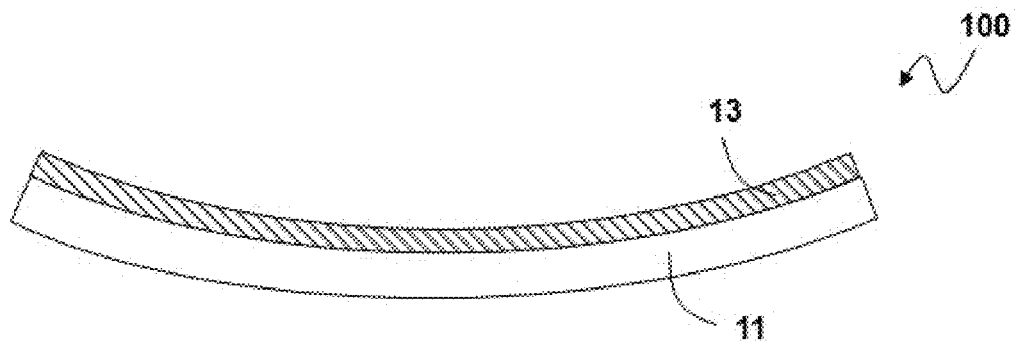

The drawings as referred to throughout the description of the present invention are for illustrative purpose only, to show the interrelations between the layers and the process steps, but not drawn according to actual scale. The orientation wordings in the description such as: above, under, left, or right are for reference with respect to the drawings, but not for limiting the actual product made according to the present invention.

Referring to FIGS. 2A-2D, a first embodiment of the present invention is shown. FIGS. 2A-2C are cross section views illustrating the manufacturing steps of a semiconductor composite film 200 with a heterojunction. As shown in FIG. 2A, first, a semiconductor substrate 21 is provided, which can be but not limited to a silicon substrate, a silicon carbide substrate, or a sapphire substrate, etc. Next, a semiconductor epitaxial layer 23 is formed on the semiconductor substrate 21 by for example but not limited to an epitaxial growth process, wherein the semiconductor epitaxial layer for example can be but not limited to a GaN (Gallium Nitride) layer. As shown in the figures, the semiconductor epitaxial layer 23 includes a firs surface 231 and a second surface 232 opposite to each other, and a heterojunction is formed between the first surface 231 and the semiconductor substrate 21. Referring to FIG. 2B, a photoresist layer 25 is formed on the semiconductor epitaxial layer 23 by, for example but not limited to a lithographic process, to define the etching area. Next, as shown in FIG. 2C, the semiconductor epitaxial layer 23 is etched from the second surface 232 toward the first surface 231 by an etching process to form at least one recess 233, and thereafter the photoresist layer 25 is removed. The recess 233 is provided for mitigating the strain in the semiconductor composite film 200, so that the semiconductor composite film 200 is relatively flatter to facilitate the subsequent manufacturing process such as a wafer back-grinding process, etc. FIG. 2D shows a cross section view taken along the cross section line AA' of FIG. 2C. The depth of the etching can be set according to the desired flatness and the rigidity of the semiconductor composite film 200; in one embodiment, the depth can be set so that the at least one recess 233 penetrates the semiconductor epitaxial layer 23, and the etch stops in the semiconductor substrate 21 or stops substantially on the same plane (at about the same elevation level) as the heterojunction. That is, the recess 233 has a bottom, and the depth of the etch can be set so that the bottom is in the semiconductor substrate 21, or the bottom is substantially on the same plane as the heterojunction.

This embodiment of the present invention is different from the prior art in that it includes at least one recess 233 formed in the semiconductor epitaxial layer 23 of the semiconductor composite film 200, and the recess 233 opens toward outside of the semiconductor composite film 200 to mitigate the stress at the heterojunction, so that the strain of the semiconductor composite film can be reduced.

Figure 3A:
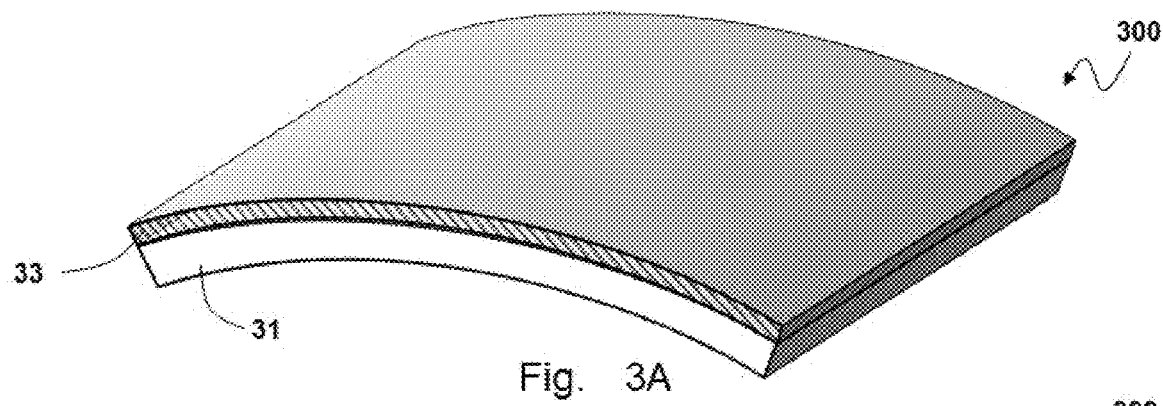
FIGS. 3A-3C show the second preferable embodiment of the present invention.
Figure 3B:
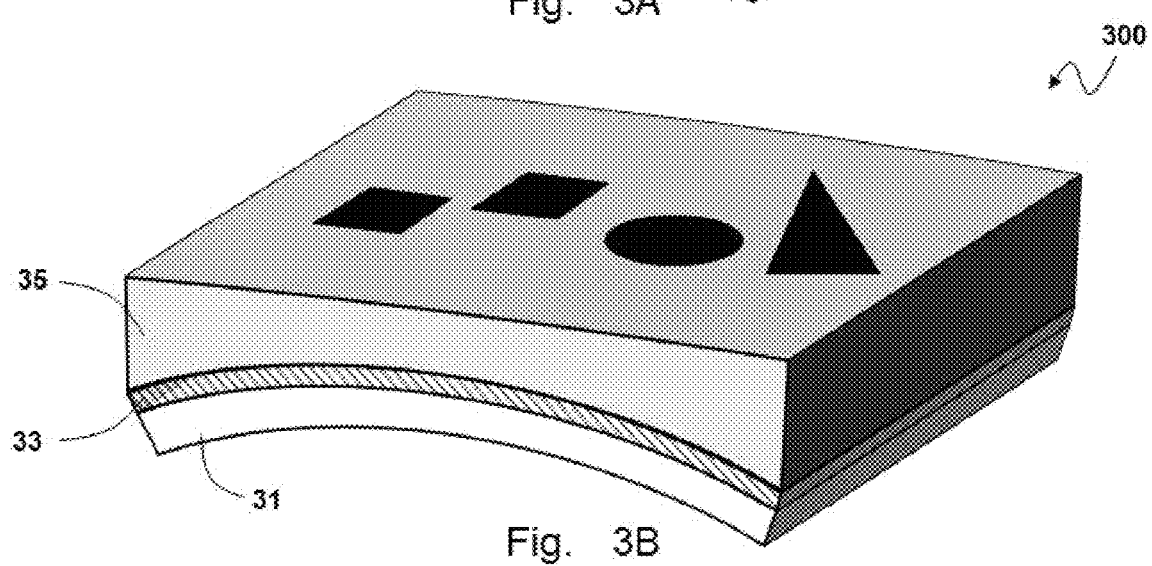
Figure 3C:
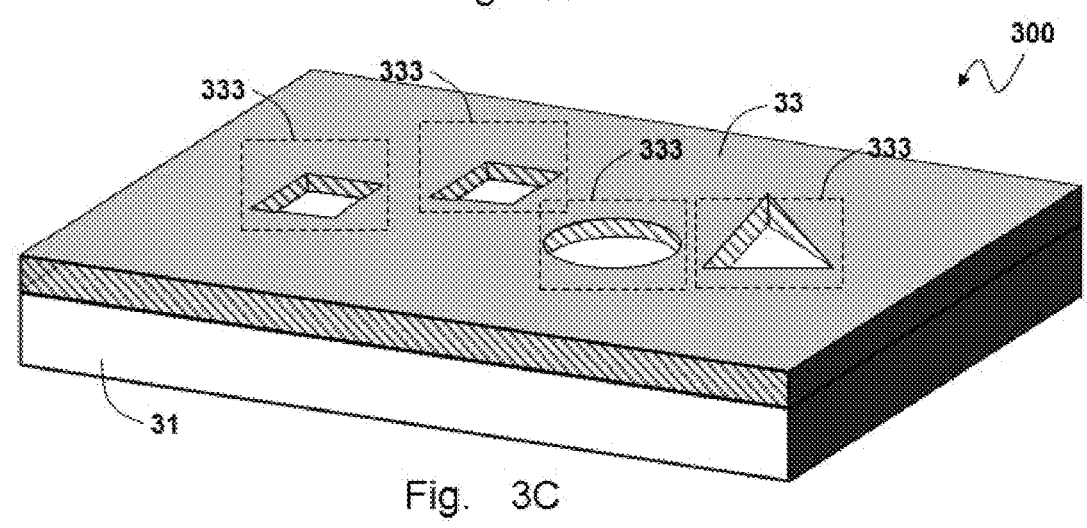

FIGS. 3A-3C show a second embodiment of the present invention, wherein the semiconductor composite film 300 with a heterojunction includes a semiconductor substrate 31 and a semiconductor epitaxial layer 33 formed on the semiconductor substrate 31. Similar to the first embodiment, the semiconductor composite film 300 of the second embodiment can be manufactured as thus. First, a semiconductor substrate 31 is provided, and a semiconductor epitaxial layer 33 is formed on the semiconductor substrate 31 for example by an epitaxial growth process. Next, an etching area is defined by a photoresist layer 35 which is formed on the semiconductor epitaxial layer 33 for example by a lithographic process. Next, at least one recess 333 is formed by an etching process. Different from the first embodiment, the recesses 333 of the present embodiment can have various shapes besides the circular shape the first embodiment from top view, and the recesses 333 can be arranged in any pattern.

Figure 4A:
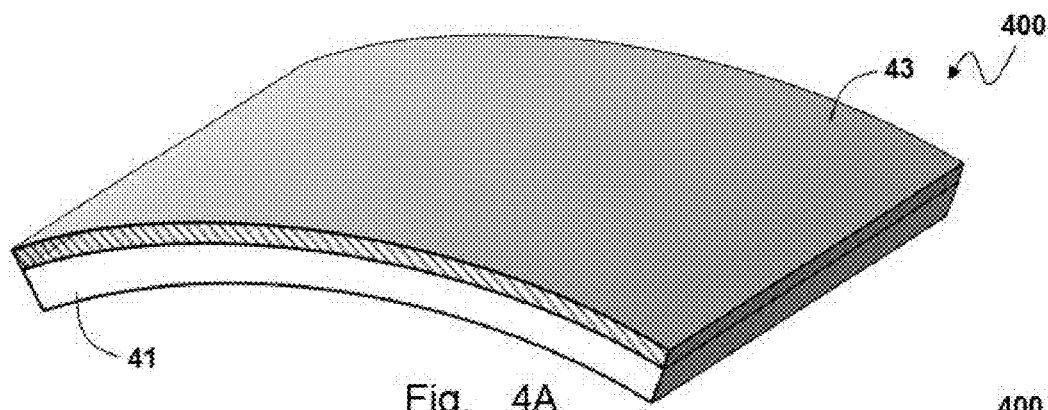
FIGS. 4A-4C show the third preferable embodiment of the present invention.
Figure 4B:
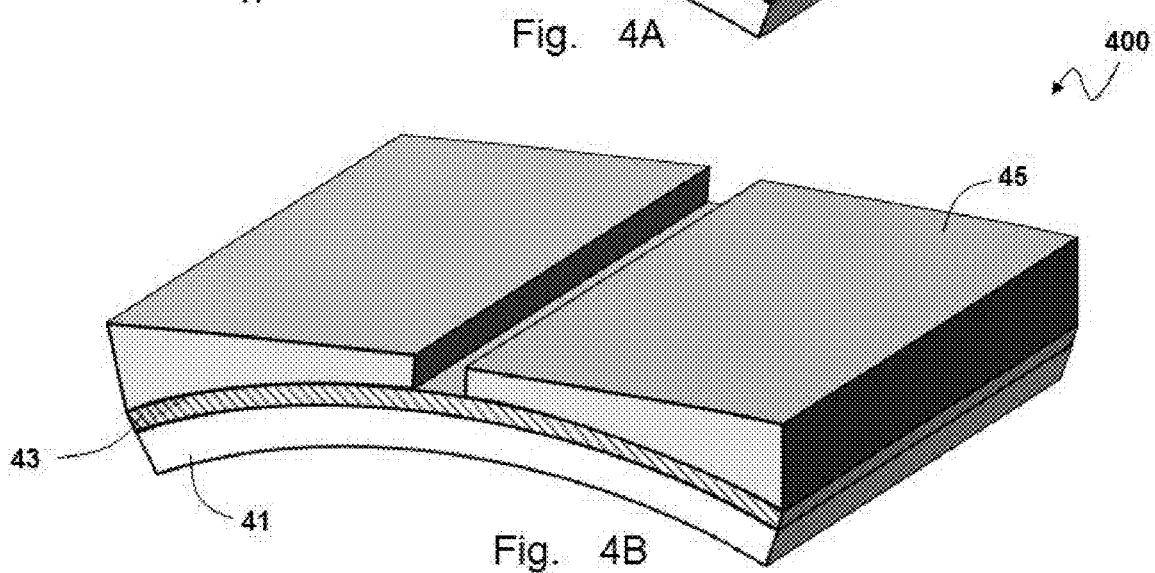
Figure 4C:
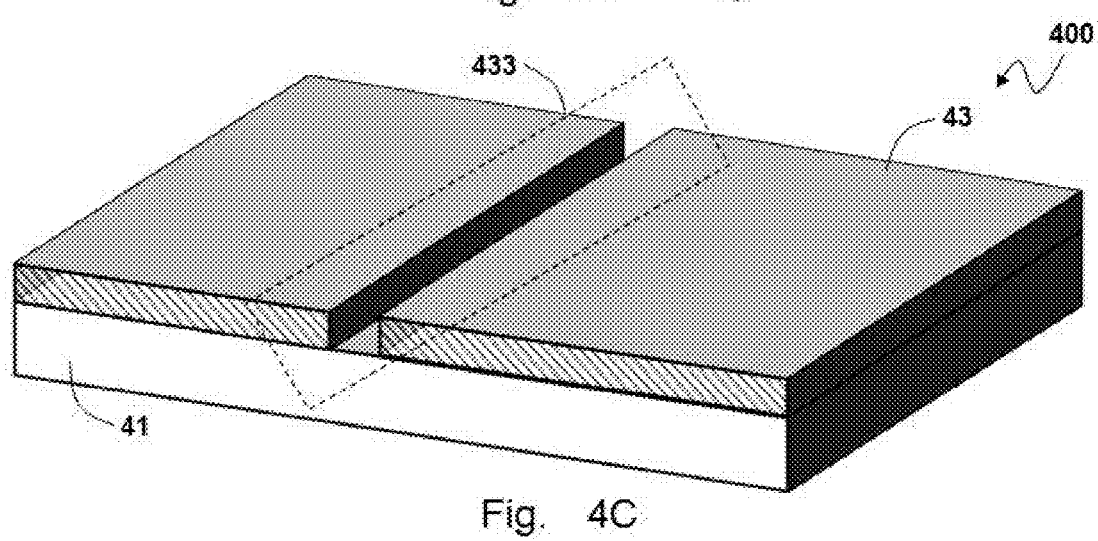

Referring to FIGS. 4A-4C, a third embodiment of the present invention is shown. As shown in the figure, a semiconductor composite film 400 with a heterojunction includes a semiconductor substrate 41 and a semiconductor epitaxial layer 43 formed on the semiconductor substrate 41. Similar to the first embodiment, the semiconductor composite film 400 of the third embodiment can be manufactured as thus. First, a semiconductor substrate 41 is provided, and a semiconductor epitaxial layer 43 is formed on the semiconductor substrate 41 for example by an epitaxial growth process. Next, an etching area is defined by a photoresist layer 45 which is formed on the semiconductor epitaxial layer 43 for example by a lithographic process. Next, at least one recess 433 is formed by an etching process. Different from the first embodiment, the recess 433 for example can be but not limited to the trench shown in FIG. 4C, and the recess 433 can completely or not completely extend across the semiconductor composite film 400 with the heterojunction. The recess 433 can have any other shape and not necessarily be a straight line.

Figure 5A:
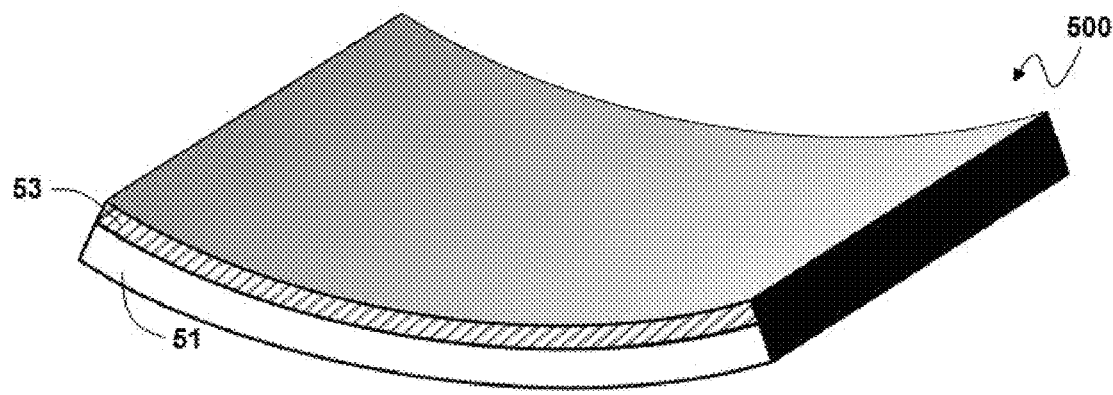
FIGS. 5A-5C show the fourth preferable embodiment of the present invention.
Figure 5B:
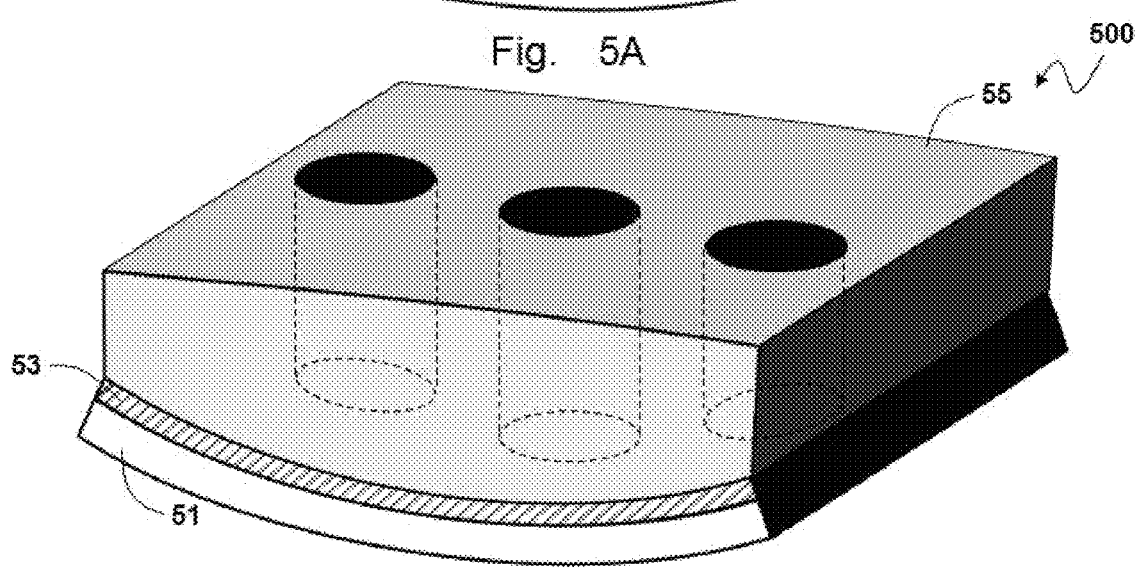
Figure 5C:
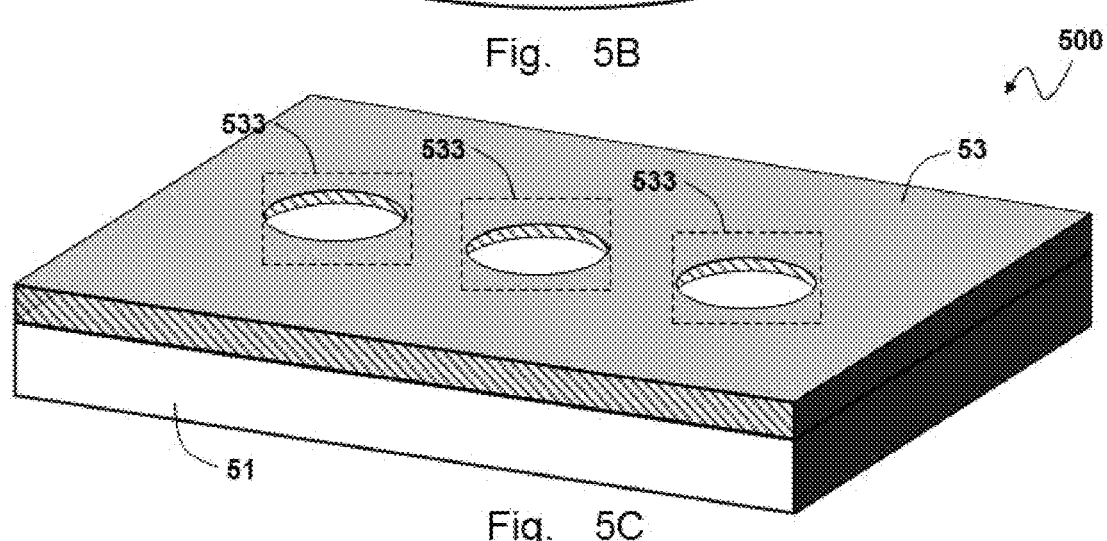

FIGS. 5A-5C show a fourth embodiment of the present invention, wherein a semiconductor composite film 500 with a heterojunction includes a semiconductor substrate 51 and a semiconductor epitaxial layer 53 formed on the semiconductor substrate 51. Similar to the first embodiment, the semiconductor composite film 500 of the fourth embodiment can be manufactured as thus. First, a semiconductor substrate 51 is provided, and a semiconductor epitaxial layer 53 is formed on the semiconductor substrate 51 for example by an epitaxial growth process. Next, an etching area is defined by a photoresist layer 55 which is formed on the semiconductor epitaxial layer 53 for example by a lithographic process. Next, at least one recess 533 is formed by an etching process. Different from the first embodiment, the heterojunction of the fourth embodiment has a tensile stress on semiconductor epitaxial layer 53 and compressive stress on semiconductor substrate 51. This shows that the present invention can be applied to cope with different types of stresses.

Figure 6A:
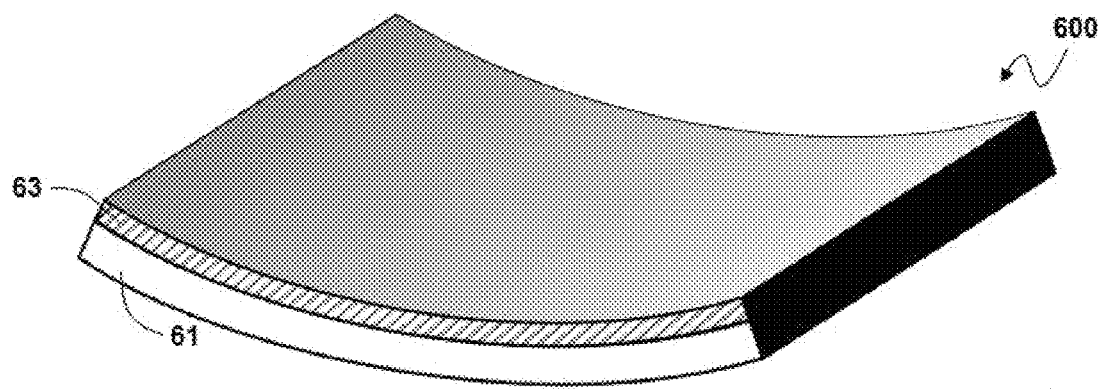
FIGS. 6A-6C show the fifth preferable embodiment of the present invention.
Figure 6B:
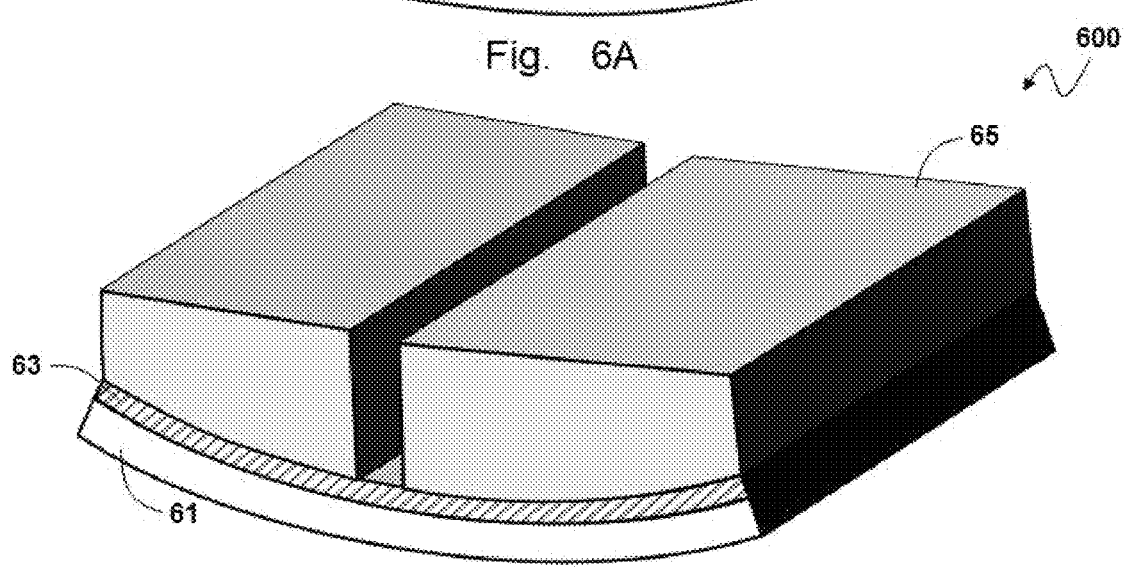
Figure 6C:
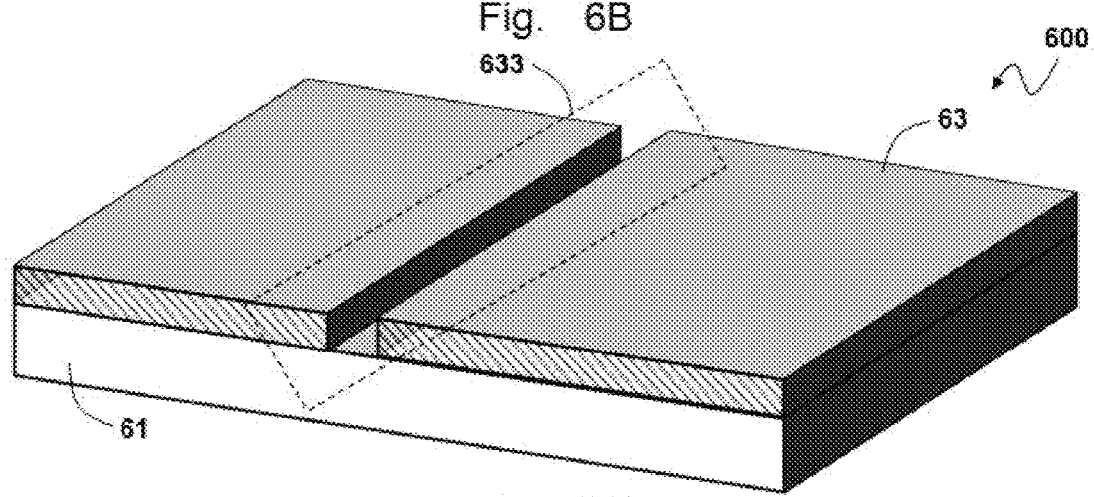

FIGS. 6A-6C show a fifth embodiment of the present invention. As shown in the figure, a semiconductor composite film 600 with a heterojunction includes a semiconductor substrate 61 and a semiconductor epitaxial layer 63 formed on the semiconductor substrate 61. Similar to the fourth embodiment, the semiconductor composite film 600 of the fifth embodiment can be manufactured as thus. First, a semiconductor substrate 61 is provided, and a semiconductor epitaxial layer 63 is formed on the semiconductor substrate 61 for example by an epitaxial growth process. Next, an etching area is defined by a photoresist layer 65 which is formed on the semiconductor epitaxial layer 63 for example by a lithographic process. Next, at least one recess 633 is formed by an etching process. Different from the fourth embodiment, the recess 633 for example can be but not limited to the trench shown in FIG. 6C, and the recess 633 can completely or not completely extend across the semiconductor composite film 600 with the heterojunction. The recess 633 can have any other shape and not necessarily be a straight line.

Figure 7:
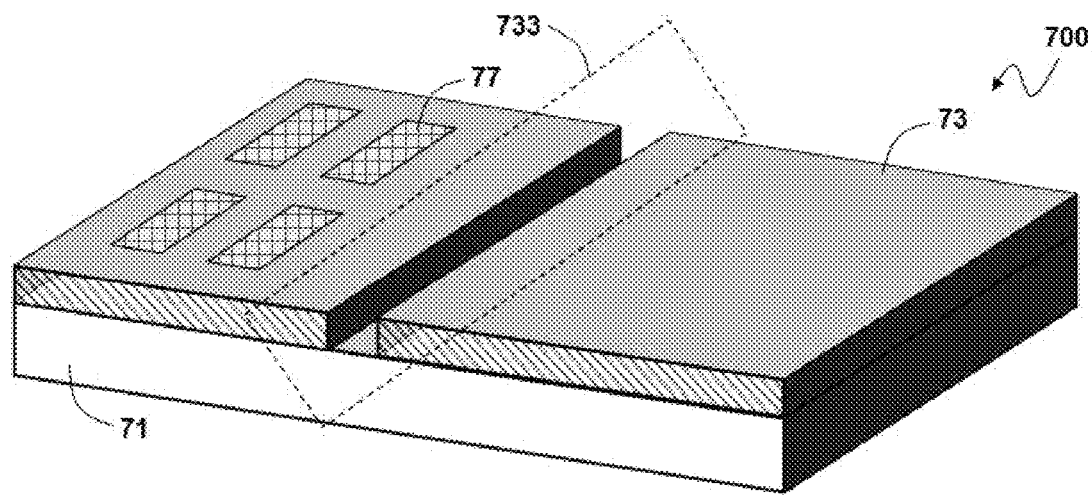
FIG. 7 shows the sixth preferable embodiment of the present invention.

FIG. 7 shows a sixth embodiment of the present invention, wherein a semiconductor composite film 700 with a heterojunction includes a semiconductor substrate 71 and a semiconductor epitaxial layer 73 formed on the semiconductor substrate 71, and a recess 733 can be formed in the semiconductor epitaxial layer 73 with a shape such as but not limited to a trench as shown in FIG. 7. Furthermore, the semiconductor epitaxial layer 73 includes at least one semiconductor device 77 which is formed in, or which includes at least a part of the semiconductor epitaxial layer 73, and the recess 733 is not located inside or does not overlap with the semiconductor devices 77. That is, the recess 733 is located in the semiconductor epitaxial layer 73 at a location where there are no semiconductor devices 77.

Figure 8:
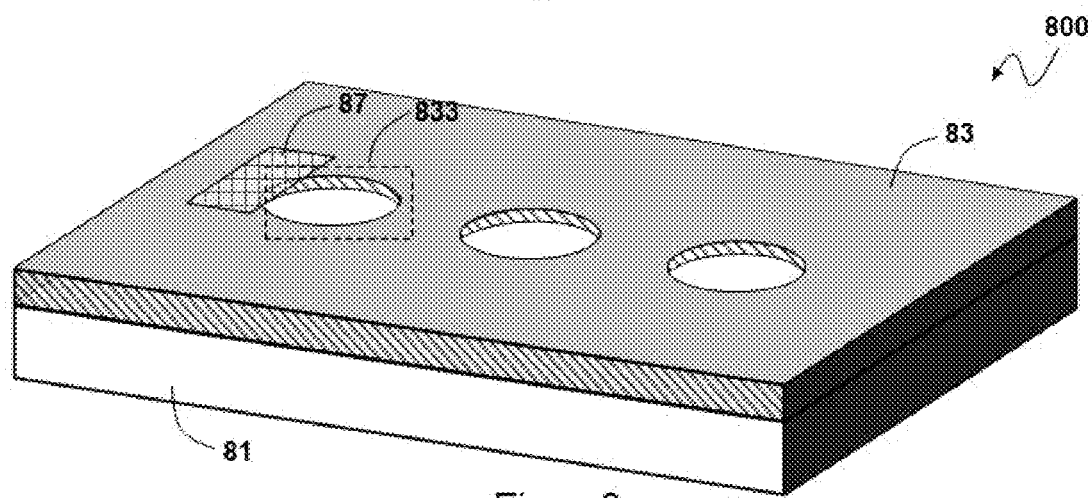
FIG. 8 shows the seventh preferable embodiment of the present invention.

FIG. 8 shows a seventh embodiment of the present invention, wherein a semiconductor composite film 800 includes a semiconductor substrate 81 and a semiconductor epitaxial layer 83 formed on the semiconductor substrate 81, and recesses 833 can be formed in the semiconductor epitaxial layer 83 to have a pattern such as but not limited to plural openings as shown in FIG. 8. Furthermore, the semiconductor epitaxial layer 83 includes at least one semiconductor device 87 which is formed in, or which includes at least a part of the semiconductor epitaxial layer 83, and the recesses 833 can partially overlap the semiconductor devices 87 as long as the recesses 833 do not affect the function of the semiconductor devices 87. That is, the semiconductor device 87 can include the part of the semiconductor epitaxial layer 83 where there is at least a portion of one recess 822, as long as the portion of the recess 833 does not affect the function of the semiconductor devices 87.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a structure or a process step which does not affect the primary function of the composite film can be added, such as a passivation layer or a buffer layer. Therefore, the scope of the present invention should include such variations and modifications. An embodiment or a claim of the present invention does not need to attain or include all the objectives, advantages or features described in the above. The abstract and the title are provided for assisting searches and not to be read as limitations to the scope of the present invention.

What is claimed is:

1. A method of manufacturing semiconductor composite film with a heterojunction, comprising:
   providing a semiconductor substrate;
   forming a semiconductor epitaxial layer on the semiconductor substrate, the semiconductor epitaxial layer having a first surface and a second surface opposite to each other, wherein the heterojunction is formed between the first surface and the semiconductor substrate; and
   forming at least one recess from the second surface inwardly toward the first surface by etching the semiconductor epitaxial layer from the second surface toward the first surface, for mitigating a strain in the semiconductor composite film.

2. The method of claim 1, further comprising: forming at least one semiconductor device in or which includes the semiconductor epitaxial layer.

3. The method of claim 1, wherein the recess has a bottom, and the recess penetrates the semiconductor epitaxial layer such that the bottom is in the semiconductor substrate.

4. The method of claim 1, wherein the recess has a bottom, and the bottom is substantially on the same plane as the heterojunction.

5. The method of claim 1, further comprising: forming at least one semiconductor device in or which includes the semiconductor epitaxial layer, and the recess does overlap with the semiconductor device.

\* \* \* \* \*